United States Patent
Gupta et al.

(10) Patent No.: US 10,180,124 B1
(45) Date of Patent: Jan. 15, 2019

(54) LASER IGNITER WITH INTEGRAL OPTIMAL GEOMETRY PRECHAMBER

(71) Applicant: Energy, United States Department of, Washington, DC (US)

(72) Inventors: Sreenath Gupta, Naperville, IL (US); Roberto Torelli, Chicago, IL (US)

(73) Assignee: U.S. Department of Energy, Washington, DC (US)

( * ) Notice: Subject to any disclaimer, the term of this patent is extended or adjusted under 35 U.S.C. 154(b) by 0 days.

(21) Appl. No.: 15/825,332

(22) Filed: Nov. 29, 2017

(51) Int. Cl.
*F02P 23/04* (2006.01)
*F02B 19/12* (2006.01)
*H01S 3/06* (2006.01)

(52) U.S. Cl.
CPC ............. *F02P 23/04* (2013.01); *F02B 19/12* (2013.01); *H01S 3/0602* (2013.01)

(58) Field of Classification Search
CPC .......... F02P 23/04; F02B 19/12; H01S 3/0602
USPC .......................... 123/143 B, 143 R, 266, 260
See application file for complete search history.

(56) References Cited

U.S. PATENT DOCUMENTS

| 7,114,858 | B2 | 10/2006 | Gupta et al. | |
|---|---|---|---|---|
| 7,438,043 | B2 * | 10/2008 | Shiraishi | F02B 19/12 123/260 |
| 7,699,033 | B2 | 4/2010 | Bihari et al. | |
| 7,770,552 | B2 | 8/2010 | Schultz | |
| 2006/0096571 | A1 * | 5/2006 | Tourteaux | F02B 17/005 123/266 |
| 2009/0107436 | A1 * | 4/2009 | Schultz | F02B 19/12 123/143 B |
| 2012/0112620 | A1 * | 5/2012 | Lykowski | F02P 23/04 313/141 |
| 2014/0165945 | A1 * | 6/2014 | Woerner | F02P 23/04 123/143 B |
| 2015/0377207 | A1 * | 12/2015 | Ridderbusch | F02P 23/04 123/143 B |

OTHER PUBLICATIONS

Bihari, B., Gupta, S., Sekar, R., Gingrich, J. and Smith, J., "Development of Advanced Laser Ignition System for Stationary Natural Gas Reciprocating Engines," ICEF2005-1325, ASME-ICE 2005 Fall Technical Conference, Ottawa Canada, 2005.

Dr. Gunther Herdin, "Laser Ignition a New Concept to Use and Increase the Potentials of the Gas Engines," 2nd Annual Advanced Stationary Reciprocating Engines Conference, Mar. 15-16, 2005.

Nicolaie Pavel, Masaki Tsunekane, and Takunori Taira, "Composite, all-ceramics, high-peak power Nd:YAG/CR4+:YAG monolithic micro-laser with multiple beam output for engine ignition," Optics Express, vol. 19, No. 10, May 2011.

(Continued)

*Primary Examiner* — Mahmoud Gimie
(74) *Attorney, Agent, or Firm* — Karen L. Blouin; Michael J. Dobbs; Brian J. Lally

(57) ABSTRACT

A laser igniter that avoids autoignition and soot formation within the prechamber and will minimize the formation of Nitrogen Oxides ($NO_x$). The laser igniter has a laser spark plug with a microlaser and a prechamber integrally formed with the laser spark plug. The prechamber has six nozzle holes with three of the nozzle holes having a large diameter and three of the nozzle holes having a small diameter. The large and small nozzle holes are in a staggered arrangement.

11 Claims, 11 Drawing Sheets

(56) References Cited

OTHER PUBLICATIONS

Joshi, S., Loccisano, F., Yalin, A. and Montgomery, D., "Comparative Performance Testing of Prechamber and Open Chamber Laser Ignition," Journal of Engineering for Gas Turbines and Power, vol. 133, Dec. 2011.

Gupta, S., Biruduganti, M. Bihari, B. Polcyn, N.,Hwang, J-U, Kanehara, K., "Performance of SI and LI Spark Plugs and that of Spark Plugs Equipped with a Prechamber," 4th Laser Ignition Conference, Yokohama, Japan, May 17-29, 2016.

* cited by examiner

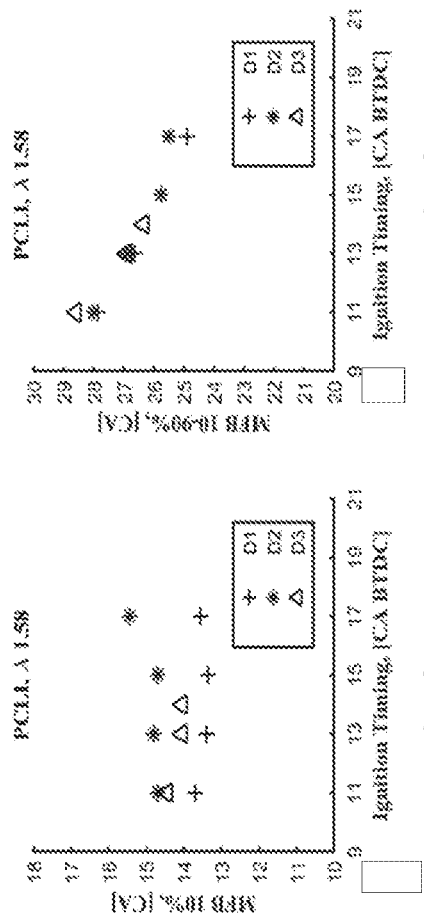

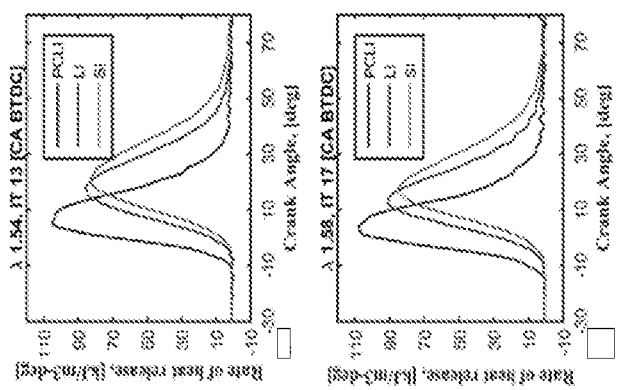
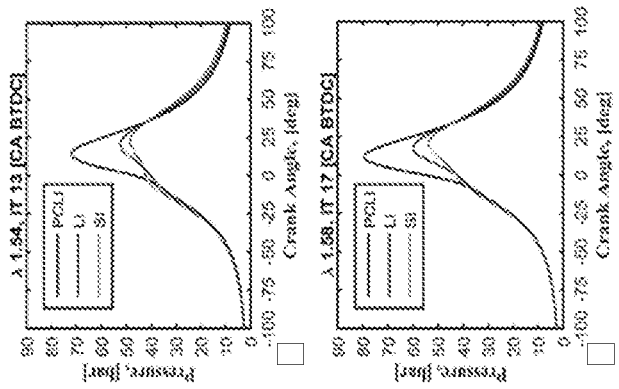
Figure 8

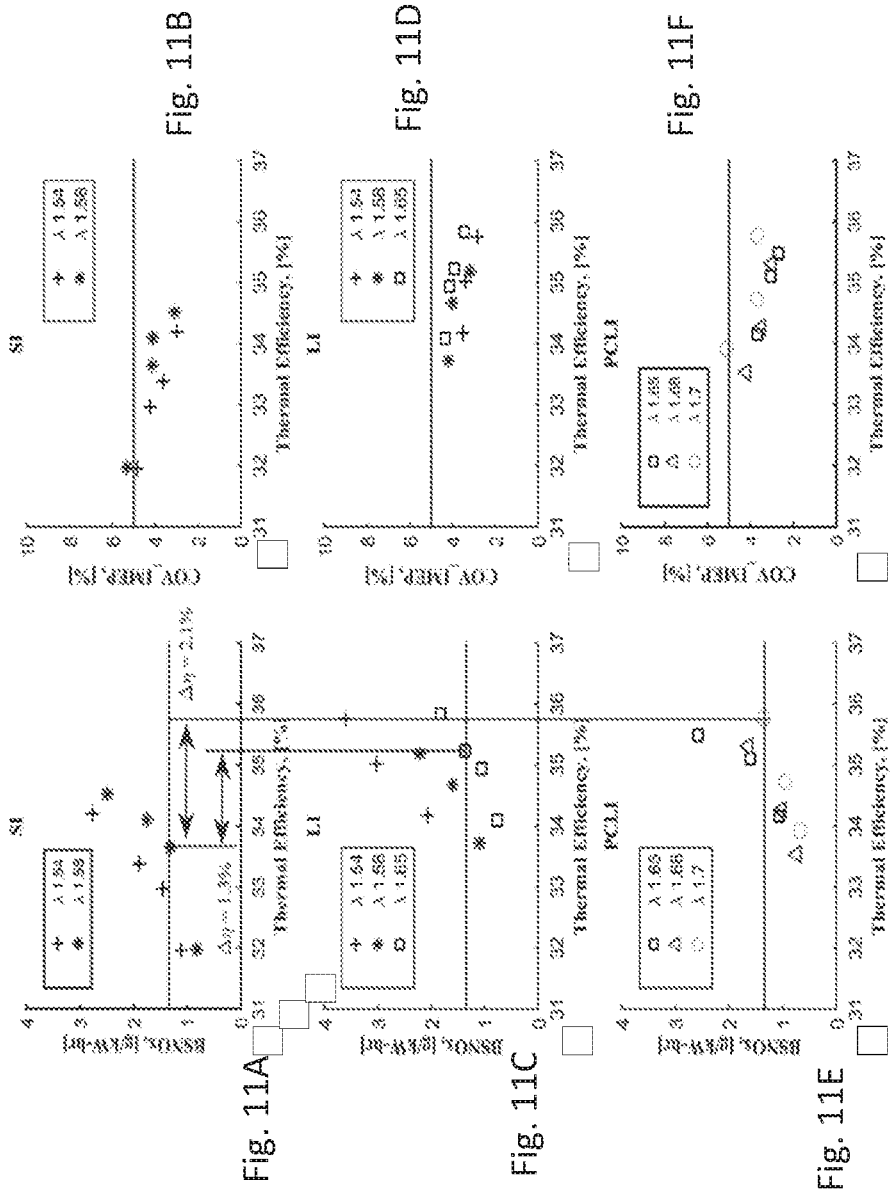

LASER IGNITER WITH INTEGRAL OPTIMAL GEOMETRY PRECHAMBER

GOVERNMENT INTERESTS

The United States Government has rights in this invention pursuant to Contract No. DE-AC02-06CH11357 between the U.S. Department of Energy (DOE) and UChicago Argonne, LLC.

FIELD OF THE INVENTION

The present invention relates to a prechamber for a laser spark plug, the prechamber having a series of nozzle holes.

BACKGROUND OF THE INVENTION

Market demands for lower fueling costs and higher specific powers in stationary natural gas engines have engine designs trending towards higher in-cylinder pressures and leaner combustion operation. Lean-burn operation of stationary natural gas engines offers lower $NO_x$ emissions and improved efficiency. However, ignition remains the main limiting factor in achieving further performance improvements in these engines. A proven pathway to extend lean-burn operation has been to use laser ignition instead of standard spark ignition. Laser ignition can ignite extremely lean air fuel mixtures. However, under lean conditions, flame speed reduces thereby offsetting any efficiency gains resulting from the higher ratio of specific heats. This loss in efficiency can be offset by increasing the number of ignition sites. Optical means to achieve this are expensive, complicated and limited in the spatial separation that they can achieve within the main combustion chamber. Therefore, a need persists to have an ignition system that ignites lean mixtures and facilitates earlier and faster combustion through multi-point ignition.

SUMMARY OF THE INVENTION

According to one aspect of the invention, a laser igniter has a laser spark plug with a longitudinal axis. The laser spark plug has a microlaser that produces laser energy. A prechamber is integrally formed with the laser spark plug with at least one circumferential wall. The circumferential wall defines a prechamber interior space. A laser focal point is disposed within the prechamber interior space in alignment with the longitudinal axis. Laser energy is focused on the laser focal point. There are at least six nozzle holes formed in the circumferential wall of the prechamber. Three of the nozzle holes have a large diameter and three of the nozzle holes have a small diameter. The large and small nozzle holes are in a staggered arrangement. The nozzle holes are angularly offset from the longitudinal axis by a predetermined angle.

BRIEF DESCRIPTION OF THE DRAWINGS

These and further aspects of the invention and their advantages can be discerned in the following detailed description, in which like characters denote like parts and in which:

FIG. 6A is a graph of the ignition delay for the three prechamber designs in the engine test at an air-to-fuel ratio ($\lambda$) equal to 1.58;

FIG. 6B is a graph of the combustion duration for the three prechamber designs in the engine test at $\lambda=1.58$;

FIG. 8A is a graph of the pressure curve for three ignition systems with Ignition Timing (IT) equal to 13 and $\lambda=1.54$;

FIG. 8B is a graph of the rate of heat release for three ignition systems with IT equal to 13 and $\lambda=1.54$;

FIG. 8C is a graph of the pressure curve for three ignition systems with IT equal to 17 and $\lambda=1.58$;

FIG. 8D is a graph of the rate of heat release for three ignition systems with IT equal to 17 and $\lambda=1.58$;

FIG. 11A is a graph of $BSNO_x$ vs. efficiency for Spark Ignition (SI) at $\lambda=1.54$ and $\lambda=1.58$ in the engine test;

FIG. 11B is a graph of Coefficient of Variation for Integrated Mean Effective Pressure (COV_IMEP) vs. efficiency for Spark Ignition (SI) at $\lambda=1.54$ and $\lambda=1.58$ in the engine test;

FIG. 11C is a graph of $BSNO_x$ vs. efficiency for Laser Ignition (LI) at $\lambda=1.54$ and $\lambda=1.58$ in the engine test;

FIG. 11D is a graph of COV_IMEP vs. efficiency for Laser Ignition (LI) at $\lambda=1.54$ and $\lambda=1.58$ in the engine test;

FIG. 11E is a graph of $BSNO_x$ vs. efficiency for Prechamber Equipped Laser Ignition (PCLI) at $\lambda=1.54$ and $\lambda=1.58$ in the engine test; and, FIG. 11F is a graph of COV_IMEP vs. efficiency for Prechamber Equipped Laser Ignition (PCLI) at $\lambda=1.54$ and $\lambda=1.58$ in the engine test.

DETAILED DESCRIPTION OF THE INVENTION

Lean-burn combustion is highly preferred in stationary natural gas engines as it offers high-efficiency with concomitant low-emissions without the need for using an aftertreatment system. However, due to the fact that most of these engines are turbocharged, ignition is compromised as the lean mixtures are under sufficiently high pressures at the time of ignition. The situation demands spark gap voltages in excess of 40 kV, which standard electrical ignition systems cannot reliably transmit. A potential pathway to overcome this limitation, while extending the lean ignition limit, has been to use laser ignition.

Based on simple thermodynamic cycles, the efficiency of an Otto cycle engine can be represented by $$\eta = 1 - \frac{1}{CR^{(\gamma-1)}}$$

where CR is the compression ratio and γ is the ratio of specific heats. The primary mechanism for efficiency improvement with lean mixtures results from increased γ values. However, the flame velocities decrease significantly in lean mixtures.

Figure 1:
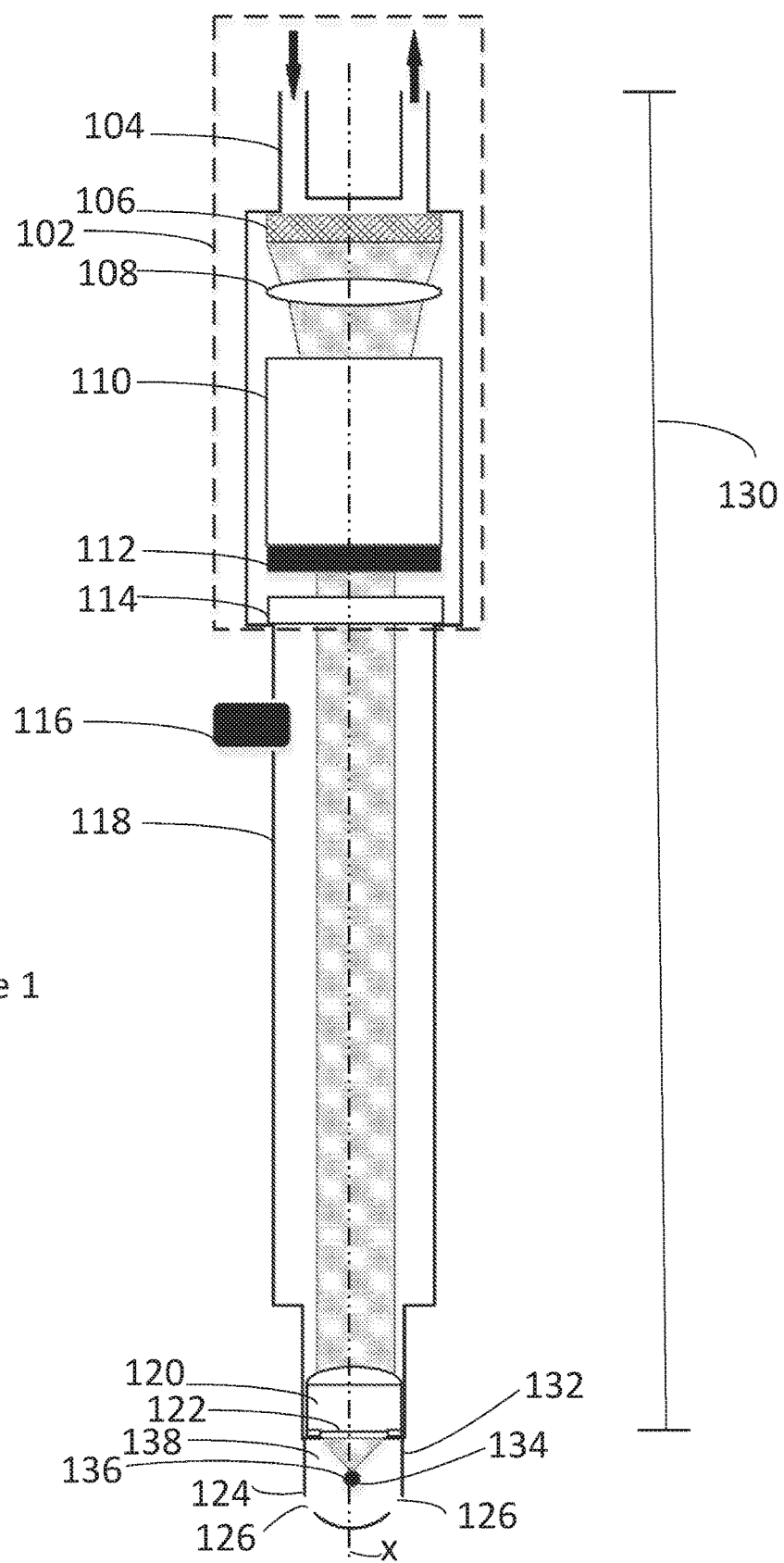
FIG. 1 shows a schematic cross section of an embodiment of the invention.

The laser ignition system consists of a laser igniter 100 and an electrically connected external laser power supply (not shown). The laser igniter 100 has a prechamber 124 integrally formed with a microlaser 102 and hollow tube 118 as illustrated in FIG. 1. The laser igniter 100 of this invention will avoid autoignition within the prechamber 124, avoid soot formation within the prechamber 124 and will minimize the formation of Nitrogen Oxides ($NO_x$). The laser igniter 100 comprises a microlaser 102 affixed to one end of a hollow tube 118. In one embodiment the microlaser 102 has water cooling 104. The microlaser 102 of the embodiment illustrated in FIG. 1 has a vertical cavity surface emitting laser 106, a lens 108, a Nd:YAG rod 110, a $Cr^{4+}$:YAG Saturable absorber 112, and a window 114. The microlaser produces laser energy. Other embodiments may have microlasers 102 with different components and materials such that an acceptable level of laser energy is produced.

As illustrated in FIG. 1, the microlaser 102 is integrally formed with a hollow tube 118. The hollow tube 118 has a photodiode 116 which provides a feedback signal to monitor accurate ignition timing. The microlaser 102 and hollow tube 118 constitute the laser spark plug 130. The laser spark plug 130 has a longitudinal axis x. One end of the hollow tube 118 ends in a sapphire lens 120 with appropriate sealing to contain the combustion gases from entering the hollow tube 118. The sapphire lens 120 focuses the beam or laser energy emitted by the microlaser 102 into the combustion chamber or prechamber 124. In one embodiment the sapphire lens 120 has a back focal length of 8.6 mm. In other embodiments the sapphire lens 120 has a focal length of other than 8.6 mm such that it produces a focal spot small enough to cause sparking. In one embodiment the radii of the curved surfaces of the sapphire lens 120 is sized to ensure a focal spot of less than 200 microns. In a further embodiment the sapphire lens 120 can withstand cylinder pressures up to 360 bar. In one embodiment the seal 122 is a copper seal. Other embodiments may have seals 122 using resilient materials other than copper such that the seal 122 produces acceptable results.

Figure 3:
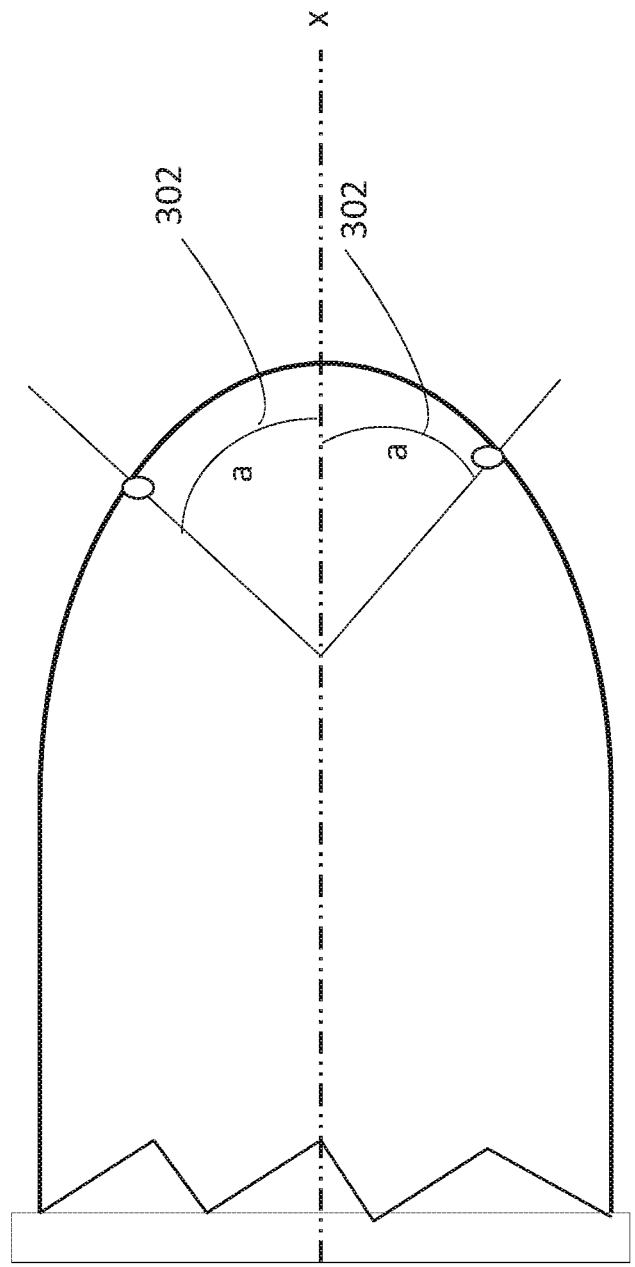
FIG. 3 is a schematic drawing of the prechamber of one embodiment of the invention.

As illustrated in FIG. 1, a prechamber 124 is integrally formed with the end of the laser spark plug 130. The prechamber 124 has a circumferential wall 132 which defines a prechamber interior space. The circumferential wall 132 may be formed with any material that produces acceptable results. In one embodiment the circumferential wall 132 is formed of nickel. The selection of a highly conductive material for the circumferential wall 132 helps in efficient heat dissipation which avoids hot spot formation that may initiate autoignition. Additionally, the circumferential wall 132 is formed with curved surfaces as illustrated in FIGS. 1 and 3 thereby avoiding sharp edges that can act as potential hot spots.

The geometry of the prechamber 124, including the volume, number of nozzle holes 126 and nozzle diameters are critical parameters that impact the overall performance of the laser igniter 100. In particular, the prechamber 124 volume and number of nozzle holes 126 impact ignition performance as well as the formation of $NO_x$, CO and unburnt hydrocarbons.

In one embodiment the prechamber 124 volume is approximately 1600 $mm^3$ corresponding to approximately 0.08% of the combustion chamber volume. The focal point of the laser 134 is positioned within the prechamber 124. In one embodiment the diameter of the prechamber 124 is approximately 15.3 mm. In one embodiment the prechamber 124 has a length of approximately 17.1 mm. Alternate embodiments may have prechambers 124 of different sizes such that acceptable results are obtained.

In operation the laser energy is focused on the laser focal point. A focused laser beam expands at a steady rate downstream of the focal point 136. The prechamber interior space 138 is sized such that if for any reason sparking does not occur at the focal spot 136, and the full laser energy were to be incident on the circumferential wall 132, the laser fluence will be less than 0.5 $GW/cm^2$ which is the threshold for plasma formation on solid surfaces leading to laser ablation.

Figure 2:
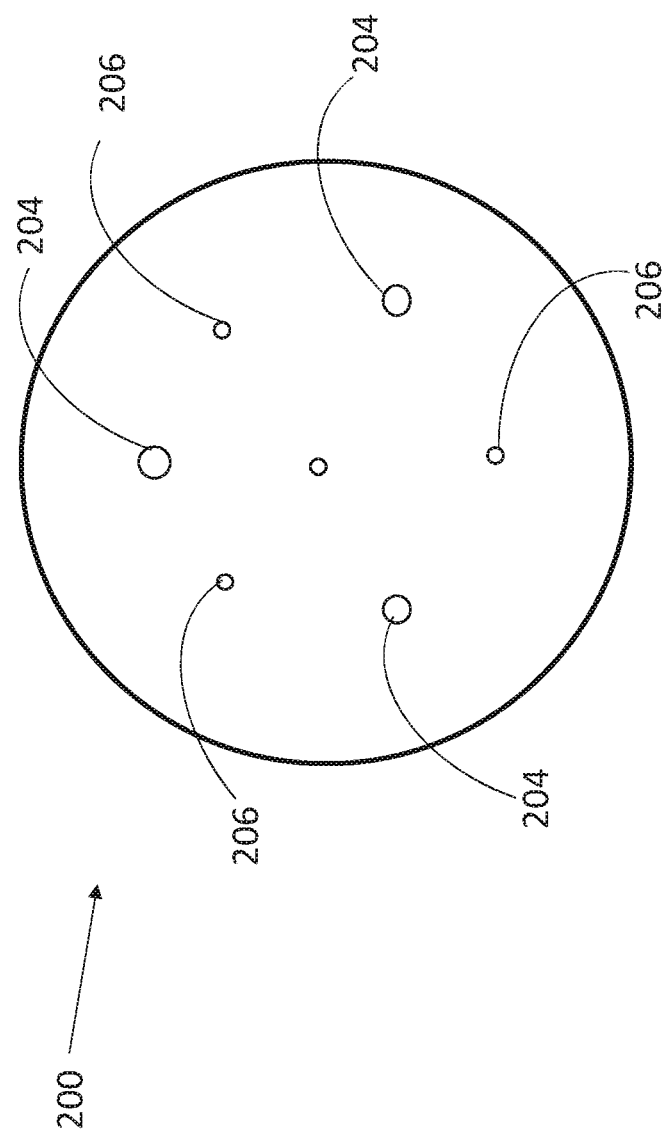
FIG. 2 is a front view of the prechamber of one embodiment of the invention.

FIG. 2 illustrates the prechamber 124 with six nozzle holes 204, 206 formed in the circumferential wall 132. As illustrated in FIG. 3, the nozzle holes 204, 206 are each offset from the longitudinal axis by a predetermined angle "a" 302. In one embodiment the predetermined angle "a" 302 is approximately forty-five degrees. In alternate embodiments the predetermined angle "a" 302 may be between approximately zero and ninety degrees. The predetermined angle of the nozzle holes 204, 206 is such that the heating of the intake and exhaust valves is avoided. The predetermined angle of the nozzle holes 204, 206 is such that the emissions formation within the prechamber 124 is reduced.

As illustrated in FIG. 2, three of the nozzle holes 204 have a large diameter and three of the nozzle holes 206 have a small diameter where the nozzle holes alternate in a staggered fashion. In other words, each small diameter nozzle hole 206 is adjacent two large diameter nozzle holes 204 and each large diameter nozzle hole 204 is adjacent two small diameter nozzle holes 206. In one embodiment the large diameter nozzle holes 204 have a diameter measurement of approximately 2.0 mm. and the small diameter nozzle holes 206 have a diameter measurement of approximately 1.0 mm. In an alternate embodiment the nozzle holes 204, 206 may have diameter measurements of other than 2.0 mm and 1.0 mm. In yet a further embodiment the large diameter nozzle hole 204 may have a diameter measurement that is approximately two times the small diameter nozzle hole 206 diameter measurement. In yet further embodiments, each of the nozzle holes 204, 206 may be a size such that autoignition is avoided. In the embodiment illustrated in FIG. 2, each of the six nozzle holes 204, 206 are equidistant from each other. In alternate embodiments the six nozzle holes 204, 206 may be placed in varied distances from each other.

In operation the emitted radiation from the microlaser 102 is directly coupled by the sapphire lens 120 into the spark kernel 134. The laser igniter 100 avoids using optical fibers which have proved to be unwieldy and unreliable for practical use on engines.

Figure 4A:
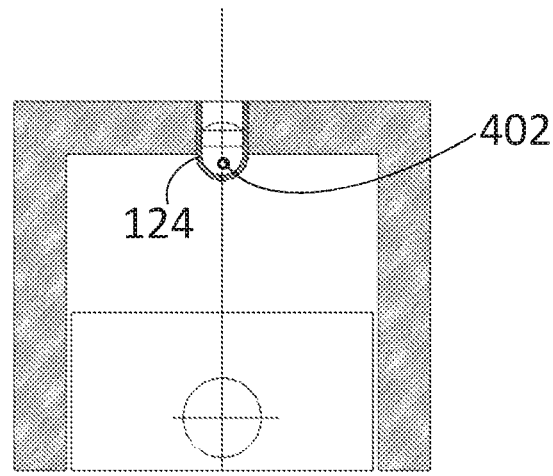
FIG. 4A is a schematic drawing of a laser spark created in a prechamber.
Figure 4B:
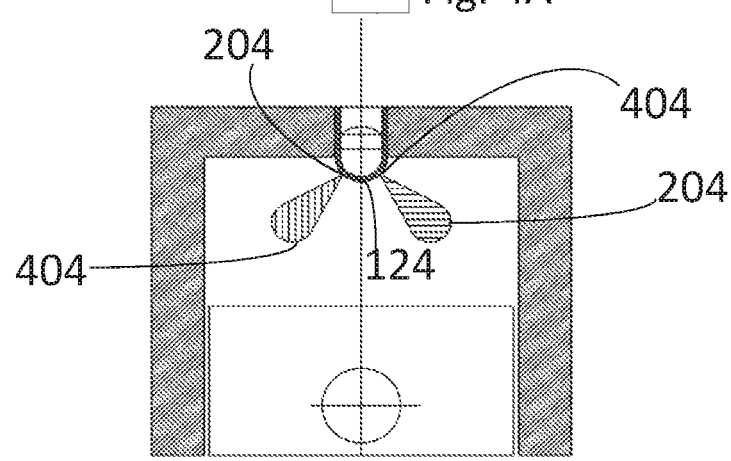
FIG. 4B is a schematic drawing of combusting jets issuing from large diameter nozzle holes.
Figure 4C:
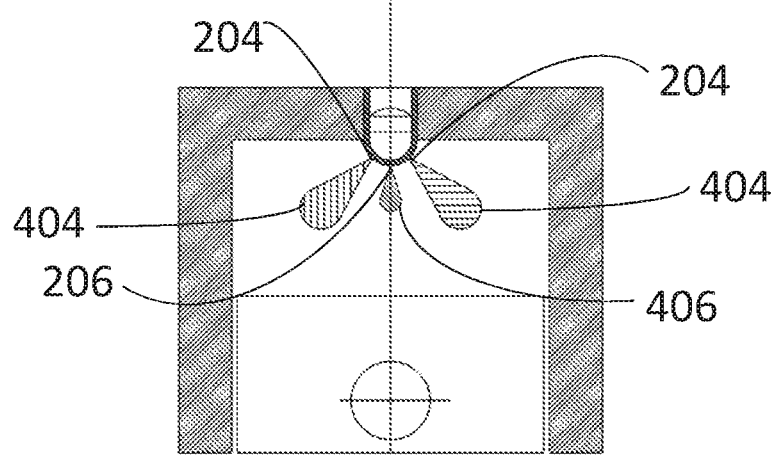
FIG. 4C is a schematic drawing of combusting jets issuing from small nozzle holes.

As illustrated in FIG. 4A, the laser spark 402 is created in the prechamber 124. FIG. 4B illustrates that combusting jets 404 issue from large nozzle holes 204. Then, as illustrated in FIG. 4C, combusting jets 406 issue from smaller holes 206. Comparing FIGS. 4B and 4C shows the large nozzle holes 204 lead to longer flame jets 404 which enables faster consumption of the fuel-air mixture within the combustion chamber or prechamber 124. Additionally the longer flame jet 404 leads to excessive $NO_x$ emission formation. The small nozzle holes 206 lead to smaller flame jets 406 which reduce the $NO_x$ emission formation but also lead to lower efficiency on account of slower fuel-air consumption. In addition, the flame jets 406 from the small nozzle holes 206 issue at a time delayed from the large nozzle holes 204. The time delay further reduces hotspots and avoids autoignition. The staggered fashion enables higher efficiency due to faster fuel-air mixture consumption while avoiding excessive $NO_x$ formation.

Experiment:

A single cylinder natural gas engine (RSi-130Q) in Argonne National laboratory was utilized in this study. The engine was a single cylinder 4-stroke, SI engine. Further specifications are as follows:

| Bore × stroke (mm) | 130 × 140 |
| Comp. Ration | 11:1 |
| Displacement (L) | 1.87 |
| Power (kW/hp) | 33/44 |
| Speed (rpm) | 1800 |
| Ignition System | SI/Laser |
| Dynamometer | 150 hp AC drive |

Figure 5:
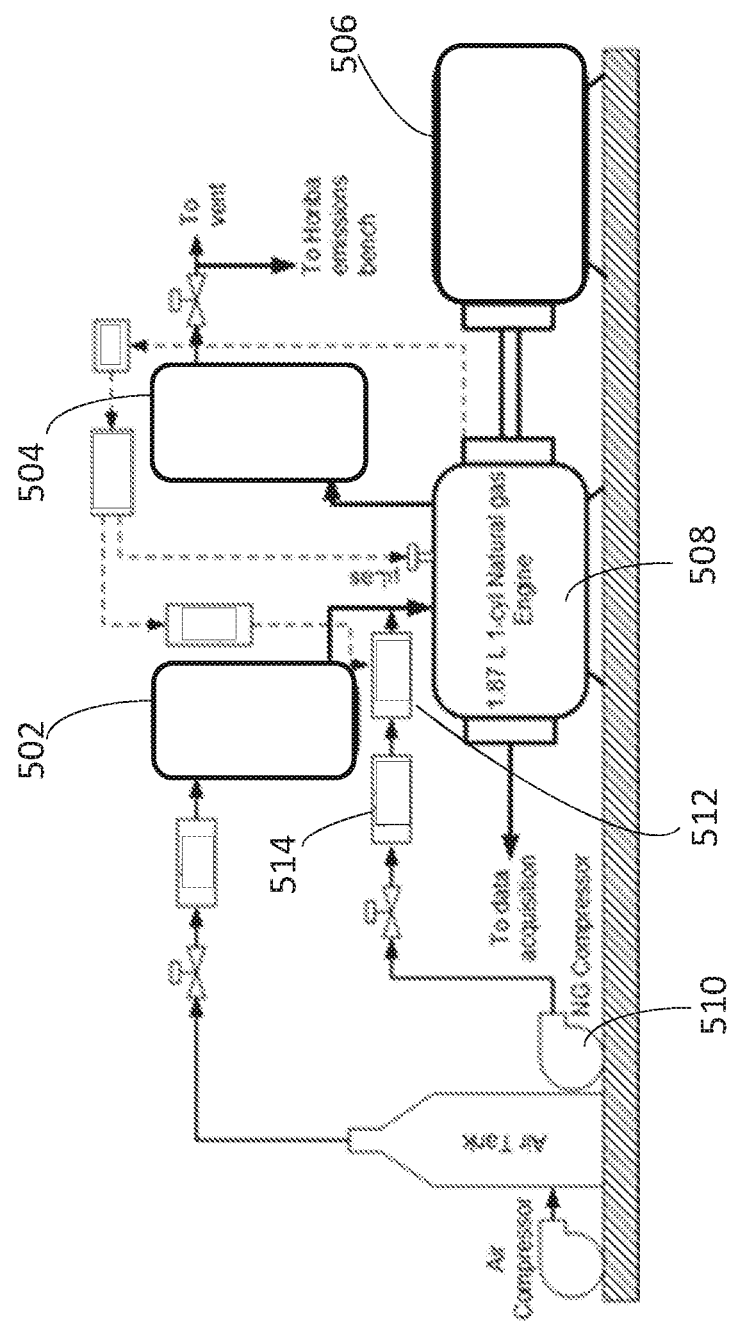
FIG. 5 is a schematic drawing of the engine test.

The schematic of the engine test setup is illustrated in FIG. 5. It is known that the single cylinder engine 508 suffers from high cyclic variation due to the pulsation in the intake and exhaust manifolds. Two surge (size) tanks 502, 504 are employed to dampen the flow pulsation. Also, with the help of two electronic valves, the surge tanks 502, 504 were used to simulate the turbocharger condition. An intake pressure in the range of 5 to 24 psi gauge was used to achieve the required Brake Mean Effective Pressure (BMEP) for each air to fuel ratio (λ 1.54, 1.58, 1.65, 1.67, 1.7 and 1.75). The engine 508 is coupled to a 111 kW AC dynamometer 506 to facilitate ignition testing. Also, an external lubrication oil and coolant systems were employed to supply the required lubricant oil at 85° C. and maintain the optimum engine temperature at 90° C. respectively.

Pipeline natural gas (PLNG) was used during the experiments. The composition of the natural gas changes slightly on a daily basis, however, a gas chromatography analysis was carried out to evaluate the composition over several days. The stoichiometric air to fuel ratio was found to be 16.39. The composition of one of the tests was:

| Gas | Molar [%] |
| --- | --- |
| Nitrogen | 1.08 |
| Carbon Dioxide | 0.7 |
| Methane | 94.53 |
| Ethane | 3.43 |
| Propane | 0.21 |
| C4-C6 | 0.04 |

The natural gas was compressed from 5 to 130 psi gauge by using a CompAire natural gas compressor 510 before directing it to the injector block 512. The PLNG flow measurement was obtained by utilizing a Micro Motion Coriolis flow meter 514 downstream of the compressor. The fuel was injected into the intake manifold with the help of two electronically controlled natural gas injectors (CAP Inc.) 512, 516. Horiba MEXA-7100D emission bench was used to measure the composition of exhaust gases (CO, $CO_2$, $NO_x$, UHC, and $O_2$). In each test case, average values of data were recorded over three minutes and used for subsequent analysis.

The in-cylinder pressure was recorded by using a piezoelectric pressure transducer (Kistler 6013B) mounted on the cylinder head. Also, a charge amplifier (Kistler 5010) was employed to convert the charge into a voltage signal. The transducer records at 100 kHz which gives approximately 10 data points every crank angle at 1800 RPM. Kistler 2614A optical shaft encoder was coupled with the engine crankshaft to determine the exact piston location. The data was recorded with a high-speed data acquisition system (AVL indicom) to perform the thermodynamics analysis. 500 consecutive cycles were recorded for each test condition; to minimize the cyclic variation, average pressure values were used to perform the heat release analysis. AVL Concerto software was used for this purpose.

A prechamber 124 with a volume of 1600 $mm^3$ corresponding to 0.08% of the combustion chamber volume with three approximately 2.0 mm diameter nozzle holes 204 and three approximately 1.0 mm diameter nozzle holes 206 in a staggered configuration was tested (D1). For comparison two other prechambers were run, one with three nozzle holes of 1.6 mm diameter (D2) and one with three nozzle holes of 2.23 mm diameter (D3).

Figures 7A, 7B:
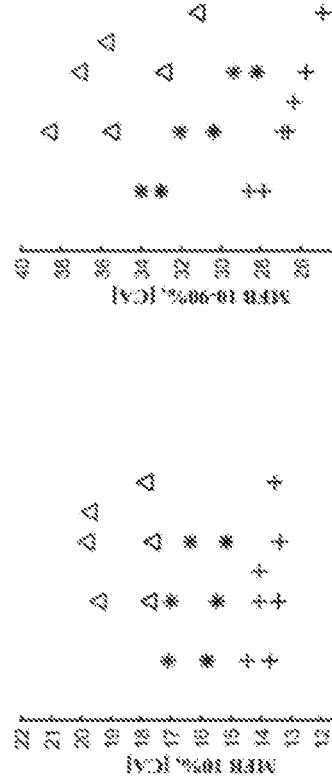
FIG. 7A is a graph of the ignition delay for two of the prechamber designs at $\lambda=1.58$, $\lambda=1.65$, and $\lambda=1.7$.
FIG. 7B is a graph of the combustion duration for two of the prechamber designs at $\lambda=1.58$, $\lambda=1.65$, and $\lambda=1.7$.

Ignition delay for the three geometries for λ=1.58 is illustrated FIG. 6A. Combustion durations for the three geometries for λ=1.58 are illustrated FIG. 6B. As seen, the combustion durations are somewhat similar. Additionally, in D2, which has the smaller total nozzle cross sectional area, autoignition was more pronounced and the design was discarded. Subsequent tests comparing D1 and D3 demonstrated that both ignition delay (see FIG. 7A) and combustion duration (see FIG. 7B) were lower with D1. Additionally, there was no incidence of autoignition in the case of D1. The superior performance of D1 is attributable to the fact that it uses 2 mm diameter and 1 mm diameter holes in a staggered fashion, which in addition to the spatial separation, leads to temporally separated issuance of jets from the larger and smaller nozzle holes (See 204, 206 on FIG. 2).

Engine tests were performed at a fixed speed of 1800 rpm and a load of 10 bar BMEP. For gradually decreasing values of λ, ignition timing (IT) sweeps were performed. To accurately identify the optimal ignition timing for the slow burning natural gas fuel that was used here, for a given λ, IT was varied between ignition advance corresponding to the EPA emissions regulation ($BSNO_x$<1.34 g/kW-hr.) and ignition retard corresponding to the limit for ignition stability (COV_IMEP<5%) as accepted in the industry.

"Ignition delay" corresponds to the time period between ignition timing and that corresponding to 10% mass burn fraction or the time in which the flame kernel survives its nascent laminar state and transitions to a fully developed turbulent deflagration. During this time scale, especially in lean mixtures, the stochastic variations in temperature, velocity and turbulence could influence the fragile flame kernel to result in significant cycle-to-cycle variations.

"Combustion duration" corresponds to the time interval between 10% and 90% mass burn fractions. This time period corresponds to most of the fuel chemical energy being converted to thermal energy in the form of high pressure combustion gases. A short combustion duration that is phased appropriately results in a major fraction of the heat release to occur at the top dead center, i.e., leading to constant volume combustion, which in turn leads to higher thermal efficiency.

The prechamber equipped laser ignition (PCLI) with the six staggered sized nozzle holes was tested against spark ignition (SI) and Laser ignition (LI) igniters. The SI is a standard Capacitance Discharge Ignition system (Altronic CD200) was used in tandem with a standard 18 mm J-style spark plug (Altronic L1863ip). The system was capable of generating up to 30 kV pulses across the gap with an average energy of 35 mJ/strike. The LI comprises of a microlaser affixed to one end of a hollow tube. The other end carries a sapphire lens (back focal length=8.6 mm) with appropriate sealing to contain the combustion gases from entering the hollow tube. The pulsed output from the microlaser (two consecutive pulses, ~15 mJ/p each, approx. 150 μs separation, 5 ns FWHM, 1064 nm) when focused creates sparks inside the combustion chamber.

The pressure curves for the three ignition systems, for two different test conditions (IT 13 @ λ=1.54, and IT 17 @ λ=1.58) are illustrated in FIGS. 8A and 8C respectively. In both conditions, LI leads to faster combustion that results in a higher peak pressure value as compared to SI. As evident from the rates of heat release illustrated in FIGS. 8B and 8D, LI also leads to shorter ignition delay. This may be attributed to larger flame kernel developed in the case of LI, which gets further amplified by heat released from combustion gases entrained from the surroundings. The net effect is accelerated combustion leading to higher peak pressures. However, in the case of PCLI, the partially combusted jets issuing from the prechamber introduce spatially distributed ignition sites at multiple locations, especially at the jet head vortices, leading to earlier and much faster combustion. This results in peak cylinder pressures approximately 20 bar larger than in SI or LI.

Figure 9:
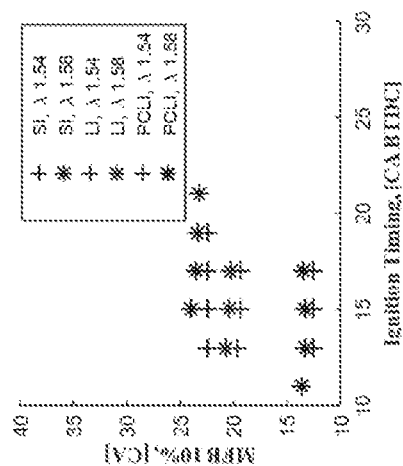
FIG. 9 is a graph of the ignition delays for the three ignition systems in the engine test.
Figure 10:
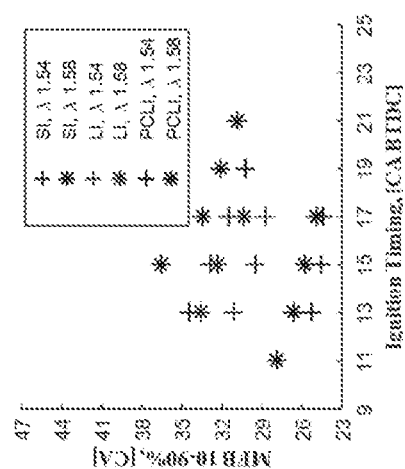
FIG. 10 is a graph of the combustion durations for the three ignition systems in the engine test.

These trends are further evident when one compares ignition delays (see FIG. 9) and combustion durations (see FIG. 10) for the three ignition systems: ignition delays for PCLI are ~10° C.AD shorter than those corresponding to SI; similarly, combustion durations are reduced ~10° C.AD for PCLI. Such trends indicate delayed ignition phasing in the case of LI and PCLI for engine optimal operation.

The $BSNO_x$ vs. efficiency and the corresponding Coefficient of Variation for Integrated Mean Effective Pressure (COV_IMEP) vs. efficiency plots for the three ignition systems are illustrated in FIGS. 11A-F. Also illustrated in these figures are horizontal lines that are the allowable levels for $BSNO_x$ per EPA regulation (1.34 g/kW-hr) and the industry acceptable value for ignition stability (COV_IMEP=5%). FIGS. 11A, 11C and 11E show $BSNO_x$ vs. efficiency for SI, LI and PCLI respectively, at λ=1.54 and λ=1.58. FIGS. 11B, 11D and 11F show Coefficient of Variation for Integrated Mean Effective Pressure (COV_IMEP) vs. efficiency for SI, LI and PCLI respectively, at λ=1.54 and λ=1.58. For all three ignition systems, for a given λ value, $NO_x$ emissions increase with increase in efficiency (resulting from ignition advance), whereas COV_IMEP decreases (i.e., ignition stability improves) at higher efficiency.

Additionally, LI extends lean operation to λ=1.65, whereas PCLI extends it even further to λ=1.7. Within the bounds of EPA regulated $NO_x$ emissions and acceptable ignition stability, the optimal operational point for a given ignition system was chosen as the λ and IT combination that offers the maximum efficiency. This results in LI exhibiting an incremental efficiency improvement of Δη=1.3%, whereas PCLI performs even better with an improvement of Δη=2.1%. As mentioned before, this is largely attributed to the spatially distributed ignition sites facilitated by PCLI, which lead to faster combustion and close to the top dead center. Additionally, the Brake Specific Carbon Monoxide (BSCO) and Brake Specific Hydrocarbon (BSHC) emission values for the optimal operational points were close to one another, implying similar combustion efficiencies.

PCLI proved to have the best performance. It not only led to extension of the lean ignition limit, but also shortened ignition delay and combustion duration significantly. As a result, within the bounds of EPA emissions limits and industry accepted ignition instability limits, an overall efficiency improvement of 2.1% points was observed. In summary, the larger initial flame kernel facilitated by laser ignition leads to extension of the lean ignition limit. Multiple partially combusted turbulent flame jets issuing from the prechamber, on account of their spatial distribution, lead to volumetric and faster ignition. As a result, overall ignition stability is improved under lean burn conditions It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

The invention claimed is:

1. A laser igniter comprising:
   a laser spark plug, the laser spark plug having a longitudinal axis and a microlaser, the microlaser producing laser energy;
   a prechamber integrally formed with the laser spark plug, at least one circumferential wall defining a prechamber interior space, a laser focal point disposed within the prechamber interior space in alignment with the longitudinal axis, the laser energy focused on the laser focal point;
   at least six nozzle holes formed in the circumferential wall, three of the at least six nozzle holes having a large diameter of approximately 2 mm. and three of the at least six nozzle holes having a small diameter of approximately 1 mm., the large diameter nozzle holes and the small diameter nozzle holes being placed in a sequentially alternating arrangements,;
   each of the at least six nozzle holes angularly offset from the longitudinal axis by a predetermined angle such that after a laser spark is created in the prechamber interior space, combusting jets issue from the large diameter nozzle holes before combusting jets issue from the small diameter nozzle holes.

2. The laser igniter system of claim 1, wherein the predetermined angle is approximately forty-five degrees.

3. The laser igniter system of claim 1, wherein the prechamber interior space is sized such that the laser energy failing to spark at the laser focal spot has a laser fluence of less than 0.5 $GW/cm^2$.

4. The laser igniter system of claim 1, wherein the prechamber is formed from a highly conductive material.

5. The laser igniter system of claim 1, wherein the prechamber has a length of approximately 17.1 mm.

6. The laser igniter system of claim 1, wherein the prechamber has a diameter of approximately 15.3 mm.

7. The laser igniter system of claim 1, wherein the prechamber has a volume of approximately 1600 millimeter cubed.

8. The laser igniter system of claim 1, wherein the large diameter is approximately two times the small diameter.

9. The laser igniter system of claim 1, wherein the predetermined angle is greater than zero degrees and less than ninety degrees.

10. The laser igniter system of claim 1, wherein the large diameter and small diameter are chosen such that autoignition is avoided.

11. The laser igniter system of claim 4, wherein the prechamber is formed from nickel.

* * * * *